United States Patent
Miyaishi et al.

(10) Patent No.: US 11,859,288 B2
(45) Date of Patent: Jan. 2, 2024

(54) CORROSION-RESISTANT MEMBER

(71) Applicant: SHOWA DENKO K.K., Tokyo (JP)

(72) Inventors: So Miyaishi, Tokyo (JP); Masahiro Okubo, Tokyo (JP); Masayuki Yoshimura, Tokyo (JP); Wataru Sakane, Tokyo (JP); Teppei Tanaka, Tokyo (JP); Saeko Nakamura, Tokyo (JP); Saori Yamaki, Tokyo (JP)

(73) Assignee: Resonac Corporation, Tokyo (JP)

( * ) Notice: Subject to any disclaimer, the term of this patent is extended or adjusted under 35 U.S.C. 154(b) by 76 days.

(21) Appl. No.: 17/611,768

(22) PCT Filed: Sep. 3, 2020

(86) PCT No.: PCT/JP2020/033462
§ 371 (c)(1),
(2) Date: Nov. 16, 2021

(87) PCT Pub. No.: WO2021/070529
PCT Pub. Date: Apr. 15, 2021

(65) Prior Publication Data
US 2022/0251699 A1    Aug. 11, 2022

(30) Foreign Application Priority Data

Oct. 7, 2019   (JP) .................. 2019-184781

(51) Int. Cl.
*C23C 28/00*      (2006.01)
*H01J 37/32*      (2006.01)

(52) U.S. Cl.
CPC ............ *C23C 28/345* (2013.01); *C23C 28/32* (2013.01); *H01J 37/32477* (2013.01)

(58) Field of Classification Search
None
See application file for complete search history.

(56) References Cited

U.S. PATENT DOCUMENTS

| 5,756,222 A | 5/1998 | Bercaw et al. |
| 6,444,083 B1 * | 9/2002 | Steger ................ C23C 28/345 216/75 |

(Continued)

FOREIGN PATENT DOCUMENTS

| JP | 4-66657 A | 3/1992 |
| JP | 5-132789 A | 5/1993 |

(Continued)

OTHER PUBLICATIONS

Matweb, "Aluminum 5052-H32", https://www.matweb.com/search/DataSheet.aspx?MatGUID=96d768abc51e4157a1b8f95856c49028&ckck=1, accessed Apr. 18, 2023 (Year: 2023).*

(Continued)

*Primary Examiner* — Shamim Ahmed
*Assistant Examiner* — Bradford M Gates
(74) *Attorney, Agent, or Firm* — Sughrue Mion, PLLC

(57) ABSTRACT

A corrosion-resistant member including: a metal base material (10); a corrosion-resistant coating (30) formed on the surface of the base material (10); and a buffer layer (20) formed between the base material (10) and the corrosion-resistant coating (30). The base material (10) contains a main element having the highest mass content ratio among elements contained in the base material (10) and a trace element having a mass content ratio of 1% by mass or less. The corrosion-resistant coating (30) contains at least one kind selected from magnesium fluoride, aluminum fluoride, and aluminum oxide. The buffer layer (20) contains an element of the same kind as the trace element, and the content ratio obtained by energy dispersive X-ray analysis of the element of the same kind as the trace element contained in the buffer layer (20) is 2% by mass or more and 99% by mass or less.

12 Claims, 1 Drawing Sheet

(56) References Cited

U.S. PATENT DOCUMENTS

| | | | | |
|---|---|---|---|---|
| 6,830,827 B2* | 12/2004 | Narita | ................... | C23C 30/00 |
| | | | | 428/661 |
| 2006/0034724 A1* | 2/2006 | Hamano | ................ | C22C 38/04 |
| | | | | 420/39 |
| 2010/0028572 A1* | 2/2010 | Kobayashi | ............ | C04B 41/009 |
| | | | | 501/153 |
| 2021/0317551 A1 | 10/2021 | Murase | | |
| 2022/0235437 A1 | 7/2022 | Murase | | |

FOREIGN PATENT DOCUMENTS

| | | | |
|---|---|---|---|
| JP | 8-181048 | A | 7/1996 |
| JP | 11-61410 | A | 3/1999 |
| JP | 2000-169953 | A | 6/2000 |
| JP | 2003-119539 | A | 4/2003 |
| WO | 2020/008704 | A1 | 1/2020 |
| WO | 2020/213307 | A1 | 10/2020 |

OTHER PUBLICATIONS

International Search Report for PCT/JP2020/033462 dated Nov. 2, 2020.

International Preliminary Report on Patentability (with translation of Written Opinion) dated Apr. 12, 2022, issued in International Application No. PCT/JP2020/033462.

* cited by examiner

CORROSION-RESISTANT MEMBER

CROSS REFERENCE TO RELATED APPLICATIONS

This application is a National Stage of International Application No. PCT/JP2020/033462 filed Sep. 3, 2020, claiming priority based on Japanese Patent Application No. 2019-184781 filed Oct. 7, 2019.

TECHNICAL FIELD

The present invention relates to a corrosion-resistant member.

BACKGROUND ART

In a semiconductor manufacturing process, highly corrosive gases, such as chlorine gas and fluorine gas, are sometimes used, and therefore members constituting a semiconductor manufacturing apparatus are required to have corrosion resistance. Examples of the members constituting the semiconductor manufacturing apparatus include chambers, pipes, gas storage devices, valves, susceptors, shower heads, and the like.

PTL 1 discloses a corrosion-resistant member obtained by forming a corrosion-resistant coating composed of a magnesium fluoride film on the surface of a base material composed of metal. PTL 2 discloses a corrosion-resistant aluminum alloy material in which the surface of a base material composed of an aluminum alloy containing magnesium is coated with a corrosion-resistant coating composed of a fluoride passivation film containing magnesium fluoride.

CITATION LIST

Patent Literature

PTL 1: JP 2000-169953 A
PTL 2: JP 4-66657 A

SUMMARY OF INVENTION

Technical Problem

However, the corrosion-resistant members disclosed in PTLS 1, 2 have had a problem that the corrosion-resistant coatings are likely to peel off from the base material due to a thermal history.

It is an object of the present invention to provide a corrosion-resistant member in which a corrosion-resistant coating is difficult to peel off from a base material even when subjected to a thermal history.

Solution to Problem

In order to solve the above-described problem one aspect of the present invention is as described in [1] to [5] below.

[1] A corrosion-resistant member including: a metal base material; a corrosion-resistant coating formed on the surface of the base material; and a buffer layer formed between the base material and the corrosion-resistant coating, in which the base material contains a main element which is an element having the highest mass content ratio among elements contained in the base material and a trace element which is an element having a mass content ratio of 1% by mass or less, the corrosion-resistant coating contains at least one kind selected from magnesium fluoride, aluminum fluoride, and aluminum oxide, and the buffer layer contains an element of the same kind as the trace element, and the content ratio obtained by energy dispersive X-ray analysis of the element of the same kind as the trace element contained in the buffer layer is 2% by mass or more and 99% by mass or less.

[2] The corrosion-resistant member according to [1], in which the main element is aluminum.

[3] The corrosion-resistant member according to [1] or [2], in which the trace element is at least one kind selected from chromium, nickel, iron, and copper.

[4] The corrosion-resistant member according to any one of [1] to [3], in which the thickness of the buffer layer is 5 nm or more and 100 nm or less.

[5] The corrosion-resistant member according to any one of [1] to [4], in which the thickness of the corrosion-resistant coating is 100 nm or more and 50000 nm or less.

Advantageous Effects of Invention

In the corrosion-resistant member according to the present invention, the corrosion-resistant coating is difficult to peel off from the base material even when subjected to a thermal history.

DESCRIPTION OF EMBODIMENTS

One embodiment of the present invention will now be described below. This embodiment describes an example of the present invention, and the present invention is not limited to this embodiment. Further, this embodiment can be variously altered or modified and embodiments obtained by such alternations or modifications may also be included in the present invention.

Figure 1:
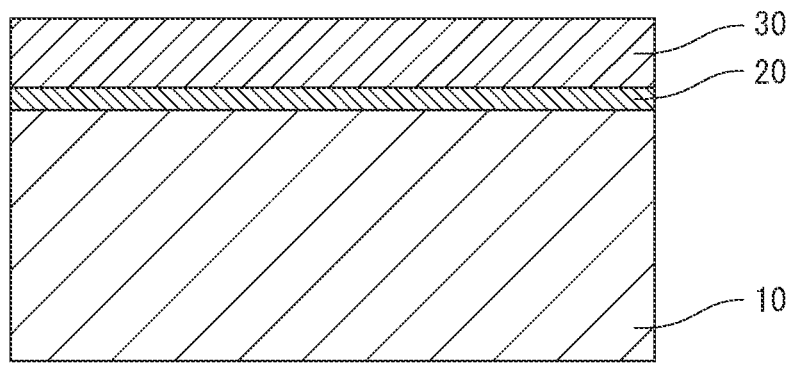
FIG. 1 is a cross-sectional view illustrating the configuration of a corrosion-resistant member according to one embodiment of the present invention.

As illustrated in FIG. 1, a corrosion-resistant member according to this embodiment includes a metal base material 10, a corrosion-resistant coating 30 formed on the surface of the base material 10, and a buffer layer 20 formed between the base material 10 and the corrosion-resistant coating 30. More specifically, the buffer layer 20 is formed on the surface of the base material 10 and the corrosion-resistant coating 30 is formed on the buffer layer 20.

The base material 10 contains a main element which is an element having the highest mass content ratio among elements contained in the base material 10 and a trace element which is an element having a mass content ratio of 1% by mass or less (for example, impurity elements, elements forming alloys). Herein, the mass content ratio of the main element in the base material 10 is preferably 50% by mass or more.

The corrosion-resistant coating 30 contains at least one kind selected from magnesium fluoride ($MgF_2$), aluminum fluoride ($AlF_3$), and aluminum oxide ($Al_2O_3$).

The buffer layer 20 contains an element of the same kind as the above-described trace element. The content ratio obtained by the energy dispersive X-ray analysis (EDS analysis) of the element of the same kind as the trace element contained in the buffer layer 20 is 2% by mass or more and 99% by mass or less.

More specifically, the buffer layer 20 is a layer containing the element of the same kind as the trace element contained in the base material 10 or a layer containing the element of the same kind as the trace element contained in the base material 10 and having a high concentration of the element of the same kind. The buffer layer 20 may contain the element of the same kind as the trace element as at least one kind of metal, intermetallic compound, alloy, oxide, and fluoride.

The corrosion-resistant member according to this embodiment includes the corrosion-resistant coating 30, and therefore has excellent corrosion resistance even in highly corrosive gas or plasma. Since the buffer layer 20 is provided, the corrosion-resistant coating 30 is difficult to peel off from the base material 10 even when subjected to a thermal history. As a result, the corrosion-resistant member according to this embodiment has excellent corrosion resistance even when subjected to a thermal history and suppresses the generation of particles resulting from the peeling of the corrosion-resistant coating 30. Further, even when the trace element contained in the base material 10 is diffused to the surface of the base material 10, the trace element is captured by the buffer layer 20, and therefore the generation of particles containing the trace element from the corrosion-resistant member is suppressed.

Such a corrosion-resistant member according to this embodiment is suitable as a member requiring corrosion resistance and heat resistance and suitable as a member constituting, for example, a semiconductor manufacturing apparatus (particularly, a film deposition apparatus using a chemical vapor deposition method). As a specific example, the corrosion-resistant member is suitable as a susceptor and a shower head of a film deposition apparatus forming a thin film on a wafer. The use of the corrosion-resistant member according to this embodiment as the member constituting the semiconductor manufacturing apparatus suppresses the generation of particles, so that a semiconductor can be manufactured with a high yield.

The corrosion-resistant member according to this embodiment can be manufactured by, for example, forming a layer composed of the element of the same kind as the trace element or a layer containing the element of the same kind as the trace element (buffer layer 20) on the surface of the base material 10 by a method, such as sputtering, and further forming the corrosion-resistant coating 30 on the buffer layer 20 by a method, such as an electrophoretic deposition method or a vapor deposition method.

The metal constituting the base material 10 may be a simple metal (containing inevitable impurities) or an alloy. The main element which is the element having the highest mass content ratio among the elements contained in the base material 10 is preferably aluminum. The trace element is preferably at least one kind selected from chromium, nickel, iron, copper, silicon, titanium, and manganese. As examples of elements contained in the base material 10 other than the main element and the trace element, magnesium can be mentioned.

The thickness of the buffer layer 20 is preferably 5 nm or more and 100 nm or less. The thickness of the corrosion-resistant coating 30 is preferably 100 nm or more and 50000 nm or less. When the thickness of the buffer layer 20 is 5 nm or more and 100 nm or less, an effect that the corrosion-resistant coating 30 is difficult to peel off from the base material 10 even when subjected to a thermal history is further enhanced. When the thickness of the corrosion-resistant coating 30 is 100 nm or more and 50000 nm or less, the corrosion resistance is further excellent. Examples of a method for measuring the thickness of the buffer layer 20 and the corrosion-resistant coating 30 include, but not particularly limited to, a transmission electron microscope (TEM), a scanning transmission electron microscope (STEM), a scanning electron microscope (SEM), and the like, for example.

Magnesium fluoride, which is the corrosion-resistant coating, may be at least one selected from magnesium fluoride ($MgF_2$), magnesium fluoride hydrate ($MgF_2 \cdot nH_2O$), magnesium fluoride containing a part of a hydroxyl group ($MgF_{2-X}(OH)_X$), magnesium fluoride hydrate containing a part of a hydroxyl group ($MgF_{2-X}(OH)_X \cdot nH_2O$), magnesium fluoride containing a part of oxygen ($MgF_{2(1-X)}O_X$), and magnesium fluoride hydrate containing a part of oxygen ($MgF_{2(1-X)}O_X \cdot nH_2O$).

Similarly, the aluminum fluoride may be at least one selected from aluminum fluoride ($AlF_3$), aluminum fluoride hydrate ($AlF_3 \cdot nH_2O$), aluminum fluoride containing a part of a hydroxyl group ($AlF_{3-X}(OH)_X$), aluminum fluoride hydrate containing a part of a hydroxyl group ($AlF_{3-X}(OH)_X \cdot nH_2O$), aluminum fluoride containing a part of oxygen ($AlF_{3(1-X)}O_{3/2X}$), and aluminum fluoride hydrate containing a part of oxygen ($AlF_{3(1-X)}O_{3/2X} \cdot nH_2O$).

Similarly, the aluminum oxide may be at least one selected from aluminum oxide ($Al_2O_3$), aluminum oxide hydrate ($Al_2O_3 \cdot nH_2O$), aluminum oxide containing a part of a hydroxyl group ($Al_2O_{3-X}(OH)_{2X}$), aluminum oxide hydrate containing a part of a hydroxyl group ($Al_2O_{3-X}(OH)_{2X} \cdot nH_2O$), aluminum oxide containing a part of fluorine ($Al_2O_{3-X}F_{2X}$), and aluminum oxide hydrate containing a part of fluorine ($Al_2O_{3-X}F_{2X} \cdot nH_2O$).

Figure 2:
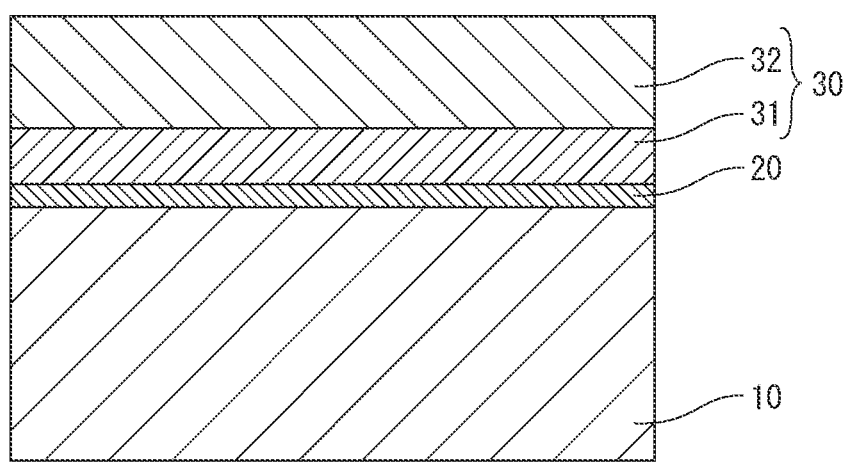
FIG. 2 is a cross-sectional view illustrating the configuration of a modification of the corrosion-resistant member of FIG. 1.

In the corrosion-resistant member, the corrosion-resistant coating 30 may contain a plurality of layers (two layers 31, 32 in the example of FIG. 2) as in a modification illustrated in FIG. 2. The plurality of layers contains different kinds of compounds. For example, when the corrosion-resistant coating 30 contains the two layers 31, 32 as in the example of FIG. 2, the layer 31 may contain magnesium fluoride and the layer 32 may contain aluminum fluoride.

EXAMPLES

Hereinafter, the present invention is more specifically described by illustrating Examples and Comparative Examples.

Example 1

A base material was subjected to sputtering, thereby forming a buffer layer on the surface of the base material, and then a corrosion-resistant coating was formed on the buffer layer by an electrophoretic deposition method. Then, the corrosion-resistant coating was subjected to post-treatment, thereby obtaining a corrosion-resistant member.

Metal constituting the base material is an aluminum alloy A5052 containing 2.55% by mass of magnesium. The aluminum alloy A5052 contains 0.23% by mass of chromium, 0.04% by mass of nickel, 0.26% by mass of iron, and 0.07% by mass of copper as trace elements.

First, pre-treatment of the above-described base material was performed. The base material was immersed for 10 minutes in a 50° C. degreasing liquid obtained by dissolving 70 g of S-CLEAN AL-13 (manufactured by SASAKI CHEMICAL CO., LTD.) in 1 L of water, and then washed with pure water. Next, the base material washed as described above was immersed for 1 minute in an etchant obtained by heating 500 g of S-CLEAN AL-5000 (manufactured by SASAKI CHEMICAL CO., LTD.) to 70° C., and then washed with pure water. Thereafter, the base material above was immersed for 30 seconds in a 25° C. smut removing liquid obtained by dissolving 200 g of Smut Clean (Raiki K.K.) in 400 g of water, and then washed with pure water, thereby completing the pre-treatment.

Next, the pre-treated base material was subjected to sputtering for the purpose of forming a buffer layer. Metals constituting the buffer layer are elements of the same kind as the trace elements, and are chromium, nickel, iron, and copper. As a target, an alloy containing chromium, nickel, iron, and copper was prepared, and then the target was arranged on a cathode of a DC magnetron sputtering apparatus. The pre-treated base material was arranged at a position facing the target, and the distance between the target and the pre-treated base material was set to 50 mm. After evacuated to a pressure of $1 \times 10^{-3}$ Pa or less, an argon gas was introduced to set the pressure to 10 Pa, and DC power was input to the target, thereby treating the target for 30 seconds. DC discharge power was set to 50 W.

Next, a corrosion-resistant coating was formed by an electrophoretic deposition method. A compound constituting the corrosion-resistant coating is magnesium fluoride. The conditions of the electrophoretic deposition method are as follows. First, 5 g of $MgF_2$ powder (manufactured by FUJI-FILM Wako Pure Chemical Corporation) having a purity of 99.99% or more was dispersed in 495 g of ethanol to which 0.15 g of ESLEAM (registered trademark) C-20931 (manufactured by NOF Corporation) was added as a dispersant for bead mill treatment to give an $MgF_2$ suspension having a primary particle size of 30 nm. In this suspension, a negative electrode having a dimension of 20 mm×25 mm×2 mm composed of the base material subjected to sputtering above and a positive electrode composed of carbon were immersed with a distance between the electrodes of 30 mm, and then a constant voltage of 50 V was applied for 120 seconds, thereby forming a particle film composed of $MgF_2$ having a thickness of about 2 μm on the surface of the negative electrode.

A post-treatment method for the corrosion-resistant coating is heat treatment under a fluorine gas ($F_2$)-containing atmosphere. The conditions of the post-treatment are as follows: the concentration of the fluorine gas in the atmosphere is 1% by volume, the concentration of a nitrogen gas is 99% by volume, the heat treatment temperature is 350° C., and the heat treatment time is 900 min.

The obtained corrosion-resistant member was subjected to a heating test, thereby evaluating the state of peeling of the corrosion-resistant coating. The conditions of the heating test are as follows: a step of increasing the temperature from an ambient temperature to 300° C. over 3 hours under a nitrogen gas atmosphere, keeping the temperature at 300° C. for 5 hours, and then reducing the temperature to an ambient temperature by natural cooling was set as one cycle, and 10 cycles were performed.

After the heating test was completed, the corrosion-resistant coating of the corrosion-resistant member was observed with a scanning electron microscope, thereby evaluating the degree of peeling. The results are shown in Table 1. In Table 1, a case where the area of a peeled part of the corrosion-resistant coating was less than 1% of the area of the corrosion-resistant coating is indicated by A, a case where the area was 1% or more and less than 10% is indicated by B, a case where the area was 10% or more and less than 30% is indicated by C, and a case where the area was 30% or more is indicated by D.

Before and after the heating test, the amount of the elements (elements of the same kind as the trace elements) present on the surface of the corrosion-resistant coating was measured by inductively coupled plasma mass spectrometry (ICP-MS). First, the corrosion-resistant member before the heating test was immersed in 100 mL of nitric acid having a concentration of 0.3% by mass for 5 minutes, thereby extracting the elements present on the surface of the corrosion-resistant coating, so that a solution was obtained. The obtained solution was subjected to the ICP-MS, thereby measuring the amount of the elements before the heating test. The corrosion-resistant member after the heating test was also subjected to a similar operation, thereby measuring the amount of the elements after the heating test.

Then, the increase rate (%) of each element before and after the heating test was calculated according to Equation below.

(Increase rate of element before and after heating test)=100×{(Amount of element after heating test)−(Amount of element before heating test)}/(Amount of element before heating test)

The results are shown in Table 1. In Table 1, a case where the "Increase rate of element before and after heating test" calculated by Equation above was less than 200% is indicated by A, a case where the increase rate was 200% or more and less than 500% is indicated by B, a case where the increase rate was 500% or more and less than 1000% is indicated by C, and a case where the increase rate was 1000% or more is indicated by D.

TABLE 1

| | Base material | Content ratio of elements of buffer layer (% by mass) | Thickness of buffer layer (nm) | Corrosion-resistant coating | Thickness of corrosion-resistant coating (μm) | State of peeing of corrosion-resistant coating | Increase rate of element before and after heating test | | | |
|---|---|---|---|---|---|---|---|---|---|---|
| | | | | | | | Cr | Ni | Fe | Cu |
| Ex. 1 | A5052 | Cr:7.4, Ni:2.0, Fe:2.9, Cu:2.5 | 37 | $MgF_2$ | 2.1 | A | A | A | A | A |
| Ex. 2 | A6061 | Cr:6.9, Ni:2.4, Fe:3.1, Cu:2.2 | 46 | $MgF_2$ | 2.3 | A | A | A | A | A |
| Ex. 3 | A5052 | Cr:7.1, Ni:2.1, Fe:2.9, Cu:2.3 | 32 | $Al_2O_3$ | 2.0 | A | A | A | A | A |
| Ex. 4 | A5052 | Cr:7.4, Ni:3.2, Fe:3.6, Cu:2.7 | 37 | $AlF_3$ | 2.3 | A | A | A | A | A |
| Ex. 5 | A5052 | Cr:6.4, Ni:2.2, Fe:2.3, Cu:2.2 | 37 | $MgF_2$, $AlF_3$ | $MgF_2$:2.1, $AlF_3$:1.7 | A | A | A | A | A |
| Ex. 6 | A5052 | Cr:7.0, Ni:2.3, Fe:3.0, Cu:2.5 | 40 | $MgF_2$ | 2.0 | A | A | A | A | A |

TABLE 1-continued

|  | Base material | Content ratio of elements of buffer layer (% by mass) | Thickness of buffer layer (nm) | Corrosion-resistant coating | Thickness of corrosion-resistant coating (μm) | State of peeing of corrosion-resistant coating | Increase rate of element before and after heating test | | | |
|---|---|---|---|---|---|---|---|---|---|---|
|  |  |  |  |  |  |  | Cr | Ni | Fe | Cu |
| Comp. Ex. 1 | A5052 | None | — | MgF$_2$ | 2.1 | C | C | D | C | D |
| Comp. Ex. 2 | A6061 | None | — | MgF$_2$ | 2.2 | C | D | D | C | D |

Example 2

A corrosion-resistant member was manufactured and evaluated in the same manner as in Example 1, except that the metal constituting the base material was an aluminum alloy A6061 containing 0.84% by mass of magnesium and 0.78% by mass of silicon. The results are shown in Table 1. The aluminum alloy A6061 contains 0.16% by mass of chromium, 0.04% by mass of nickel, 0.52% by mass of iron, and 0.25% by mass of copper as the trace elements.

Example 3

A corrosion-resistant member was manufactured and evaluated in the same manner as in Example 1, except that the concentration of the nitrogen gas was set to 100% by volume and the heat treatment temperature was set to 450° C. in the post-treatment conditions and the compound constituting the corrosion-resistant coating was aluminum oxide. As a method for forming the corrosion-resistant coating, a particle film was formed using the electrophoretic deposition method in the same manner as in Example 1 and using 5 g of aluminum hydroxide oxide (manufactured by FUJIFILM Wako Pure Chemical Corporation). The primary particle size after the bead mill treatment was 21 nm. Herein, the aluminum hydroxide oxide was heat-treated at 450° C. to form a sintered aluminum oxide film. The results are shown in Table 1.

Example 4

A corrosion-resistant member was manufactured and evaluated in the same manner as in Example 1, except that the compound constituting the corrosion-resistant coating was aluminum fluoride. As the method for forming the corrosion-resistant coating, a particle film was formed using the electrophoretic deposition method in the same manner as in Example 1 and using 5 g of aluminum fluoride powder (manufactured by FUJIFILM Wako Pure Chemical Corporation). The primary particle size after the bead mill treatment was 27 nm. The results are shown in Table 1.

Example 5

A corrosion-resistant member was manufactured and evaluated in the same manner as in Example 1, except that the compounds constituting the corrosion-resistant coating were magnesium fluoride and aluminum fluoride. The results are shown in Table 1. In Example 5, the corrosion-resistant coating contains two layers of a layer composed of magnesium fluoride and a layer composed of aluminum fluoride in the same manner as in the modification illustrated in FIG. 2. As the method for forming the corrosion-resistant coating, particle films were formed using the electrophoretic deposition method in the same manner as in Example 1 and using 5 g of magnesium fluoride powder (same as that in Example 1) and 5 g of aluminum fluoride powder (same as that in Example 4). The primary particle sizes after the bead mill treatment of the particle films each were 33 nm and 24 nm.

Example 6

A corrosion-resistant member was manufactured and evaluated in the same manner as in Example 1, except that the method for forming the corrosion-resistant coating was a vacuum deposition method. The results are shown in Table 1. The method for forming the corrosion-resistant coating in Example 6 is as follows. First, the base material subjected to sputtering was installed in a vacuum chamber, and then the inside of the vacuum chamber was evacuated until the pressure reached $2 \times 10^{-4}$ Pa. Thereafter, the base material subjected to sputtering was heated to 380° C. A magnesium fluoride sintered body material was used as a vapor deposition material, the sintered body material was irradiated with electron beams, and then a shutter was opened, so that a magnesium fluoride layer having a thickness of about 2.0 μm was formed on the base material subjected to sputtering. The electron beam input power at this time was about 40 mA at an acceleration voltage of 5 kV and the degree of vacuum in the vapor deposition was set to $5 \times 10^{-4}$ Pa.

Comparative Example 1

A corrosion-resistant member was manufactured and evaluated in the same manner as in Example 1, except that the corrosion-resistant coating was formed directly on the surface of the base material without interposing the buffer layer therebetween. The results are shown in Table 1.

Comparative Example 2

A corrosion-resistant member was manufactured and evaluated in the same manner as in Example 2, except that the corrosion-resistant coating was formed directly on the surface of the base material without interposing the buffer layer therebetween. The results are shown in Table 1.

As is understood from Table 1, in Examples 1 to 6, the peeling of the corrosion-resistant coating hardly occurred even when subjected to a thermal history.

Further, even when subjected to a thermal history, the trace elements contained in the base material were hardly diffused to the surface of the corrosion-resistant coating.

REFERENCE SIGNS LIST

10 base material
20 buffer layer
30 corrosion-resistant coating

The invention claimed is:

1. A corrosion-resistant member comprising:
   a metal base material;
   a corrosion-resistant coating formed on a surface of the base material; and
   a buffer layer formed between the base material and the corrosion-resistant coating, wherein
   the base material contains a main element which is an element having a highest mass content ratio among elements contained in the base material and a trace element which is an element having a mass content ratio of 1% by mass or less,
   the corrosion-resistant coating contains at least one kind selected from magnesium fluoride, aluminum fluoride, and aluminum oxide, and
   the buffer layer contains an element of a same kind as the trace element, and a content ratio obtained by energy dispersive X-ray analysis of the element of the same kind as the trace element contained in the buffer layer is 2% by mass or more and 99% by mass or less,
   wherein the buffer layer includes chromium, nickel, iron, and copper.

2. The corrosion-resistant member according to claim 1, wherein the main element is aluminum.

3. The corrosion-resistant member according to claim 2, wherein the trace element is at least one kind selected from chromium, nickel, iron, and copper.

4. The corrosion-resistant member according to claim 2, wherein a thickness of the buffer layer is 5 nm or more and 100 nm or less.

5. The corrosion-resistant member according to claim 2, wherein a thickness of the corrosion-resistant coating is 100 nm or more and 50000 nm or less.

6. The corrosion-resistant member according to claim 1, wherein the trace element is at least one kind selected from chromium, nickel, iron, and copper.

7. The corrosion-resistant member according to claim 6, wherein a thickness of the buffer layer is 5 nm or more and 100 nm or less.

8. The corrosion-resistant member according to claim 6, wherein a thickness of the corrosion-resistant coating is 100 nm or more and 50000 nm or less.

9. The corrosion-resistant member according to claim 1, wherein a thickness of the buffer layer is 5 nm or more and 100 nm or less.

10. The corrosion-resistant member according to claim 9, wherein a thickness of the corrosion-resistant coating is 100 nm or more and 50000 nm or less.

11. The corrosion-resistant member according to claim 1, wherein a thickness of the corrosion-resistant coating is 100 nm or more and 50000 nm or less.

12. The corrosion-resistant member according to claim 1, wherein the trace element comprises chromium, nickel, iron, and copper.

* * * * *